US011935738B2

(12) United States Patent
Okamura et al.

(10) Patent No.: US 11,935,738 B2
(45) Date of Patent: Mar. 19, 2024

(54) METHOD OF PROCESSING A WAFER

(71) Applicants: Takashi Okamura, Tokyo (JP);
Shigenori Harada, Tokyo (JP)

(72) Inventors: Takashi Okamura, Tokyo (JP);
Shigenori Harada, Tokyo (JP)

(73) Assignee: DISCO CORPORATION, Tokyo (JP)

(*) Notice: Subject to any disclaimer, the term of this patent is extended or adjusted under 35 U.S.C. 154(b) by 21 days.

(21) Appl. No.: 18/052,032

(22) Filed: Nov. 2, 2022

(65) Prior Publication Data

US 2023/0298881 A1    Sep. 21, 2023

(30) Foreign Application Priority Data

Nov. 10, 2021  (JP) .................................. 2021-183677

(51) Int. Cl.
*H01L 21/304* (2006.01)
*H01L 21/02* (2006.01)

(52) U.S. Cl.
CPC .... *H01L 21/02068* (2013.01); *H01L 21/0206* (2013.01); *H01L 21/304* (2013.01)

(58) Field of Classification Search
CPC ........... H01L 21/02068; H01L 21/0206; H01L 21/304
See application file for complete search history.

(56) References Cited

FOREIGN PATENT DOCUMENTS

JP    2013225612 A    10/2013

OTHER PUBLICATIONS

Dicing method and micromachine device, Machine Translation of JP2004050305A (Year: 2004).*
Wafer processing Method, Machine Translation of JP2013-225612A (Year: 2013).*

* cited by examiner

*Primary Examiner* — Sharidan Carrillo
(74) *Attorney, Agent, or Firm* — Greer Burns & Crain Ltd.

(57) ABSTRACT

Edge trimming is performed on a wafer while a cleaning liquid is supplied to the center of a face side of the wafer and the wafer is rotated to form a film of the cleaning liquid that covers the face side of the wafer. The film of the cleaning liquid prevents the face side of the wafer from being dried, lowering the probability that swarf will be introduced into devices on the face side of the wafer. In addition, the consumption of the cleaning liquid can be reduced compared with a step of performing edge trimming on the wafer while supplying a curtain of cleaning liquid to the entire face side of the wafer.

2 Claims, 7 Drawing Sheets

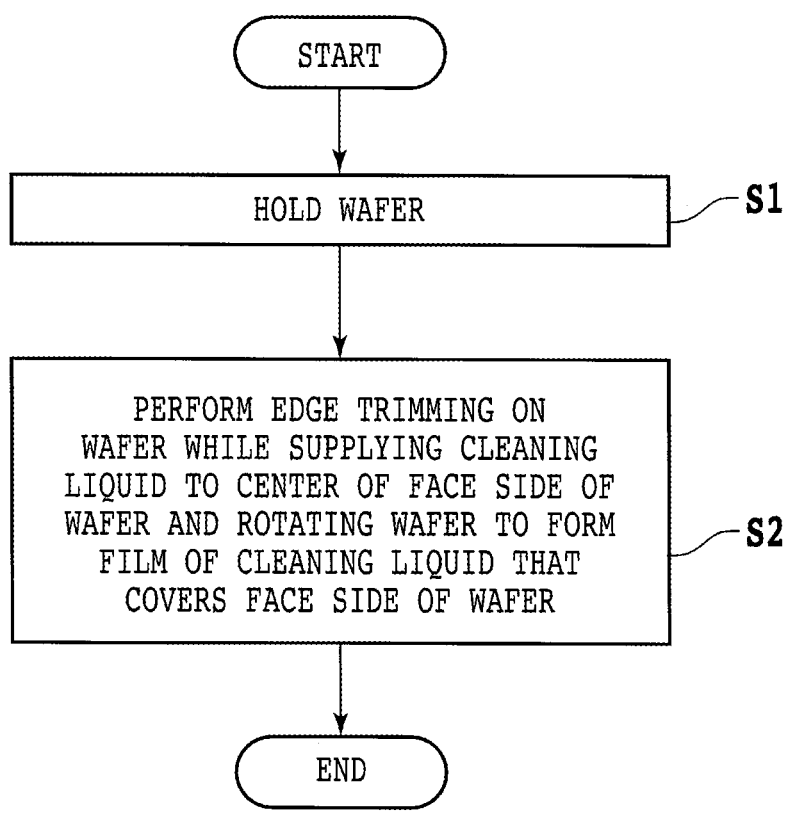

METHOD OF PROCESSING A WAFER

BACKGROUND OF THE INVENTION

Field of the Invention

The present invention relates to a method of processing a wafer having a beveled outer circumferential edge portion.

Description of the Related Art

Device chips including devices such as integrated circuits (ICs) or large-scale-integration (LSI) circuits are indispensable components in various electronic appliances such as mobile phones or personal computers. Such device chips are manufactured by forming a number of devices in respective demarcated areas on the face side of a wafer made of a semiconductor material, and then dividing the areas including the individual devices therein from each other.

Wafers that are used to manufacture device chips therefrom are likely to develop cracks in their outer circumferential edge portions where stresses tend to concentrate. Therefore, it has been general practice in the process of manufacturing device chips to bevel the outer circumferential edge portion of a wafer prior to various other fabrication steps. In addition, the process of manufacturing device chips often includes the step of, prior to dividing a wafer, grinding the reverse side of the wafer to thin down the wafer for the purpose of reducing the size of device chips to be produced from the wafer.

However, when the reverse side of the wafer with the beveled outer circumferential edge portion is ground to reduce the thickness of the wafer, the reverse side of the outer circumferential edge portion is shaped into something like a knife edge. Stresses tend to concentrate on the reverse side of the outer circumferential edge portion shaped like a knife edge, making the wafer likely to crack. To avoid such problems, it has been frequent practice in the device chip fabrication process to perform edge trimming on the wafer after the devices have been formed on the face side of the wafer but before the reverse side of the wafer is ground.

Edge trimming is carried out on a wafer by scraping off a portion of the face side of the outer circumferential edge portion of the wafer, for example. Upon edge trimming, the wafer produces scrapings as swarf. If the swarf is introduced into the devices on the face side of the wafer, then the device chips obtained when the wafer is divided are liable to decrease in quality.

In view of the above shortcoming, it has been proposed in the art to perform edge trimming on a wafer while supplying a curtain of cleaning liquid to the entire face side of the wafer (see, for example, JP 2013-225612A). The curtain of cleaning liquid supplied to the entire face side of the wafer prevents the face side of the wafer from being dried, lowering the probability that the swarf will be introduced into the devices.

SUMMARY OF THE INVENTION

However, supplying the cleaning liquid to the wafer during the edge trimming thereof naturally increases the consumption of the cleaning liquid, resulting in an increase in the cost of the device chips produced by dividing the wafer. In view of the abovementioned drawbacks, it is an object of the present inventio to provide a method of processing a wafer while reducing the consumption of a cleaning liquid without causing an increase in the probability that the swarf will be introduced into devices on the wafer.

In accordance with an aspect of the present invention, there is provided a method of processing a wafer having a plurality of devices formed on a face side thereof and having a beveled outer circumferential edge portion. The method includes a holding step of holding the wafer rotatably along circumferential directions thereof with the face side facing upwardly, and a processing step of, after the holding step, processing the outer circumferential edge portion of the wafer by, while a lower end portion of an annular cutting blade that is rotating is cutting into the outer circumferential edge portion of the wafer, supplying a cleaning liquid to the center of the face side of the wafer and rotating the wafer to form a film of the cleaning liquid that covers the face side of the wafer.

According to the aspect of the present invention, the method should preferably further include an ultraviolet ray applying step of, before the processing step, applying ultraviolet rays to the face side of the wafer to render the face side hydrophilic.

Further, the processing step should preferably include a cutting step of increasing the depth by which the lower end portion of the rotating cutting blade cuts into the outer circumferential edge portion of the wafer from the face side, and a rotating step of rotating the wafer in at least one revolution, and the cutting step and the rotating step are alternately repeated.

According to the aspect of the present invention, edge trimming is performed on the wafer while the cleaning liquid is supplied to the center of the face side of the wafer and the wafer is rotated to form the film of the cleaning liquid that covers the face side of the wafer.

The film of the cleaning liquid prevents the face side of the wafer from being dried, lowering the probability that swarf will be introduced into devices on the face side of the wafer. In addition, the consumption of the cleaning liquid can be reduced compared with a step of performing edge trimming on the wafer while supplying a curtain of cleaning liquid to the entire face side of the wafer.

The above and other objects, features and advantages of the present invention and the manner of realizing them will become more apparent, and the invention itself will best be understood from a study of the following description and appended claims with reference to the attached drawings showing a preferred embodiment of the invention.

BRIEF DESCRIPTION OF THE DRAWINGS

FIG. 5 is a flowchart schematically illustrating by way of example a sequence of a method of processing a wafer according to an embodiment of the present invention;

DETAILED DESCRIPTION OF THE PREFERRED EMBODIMENT

Figure 1:
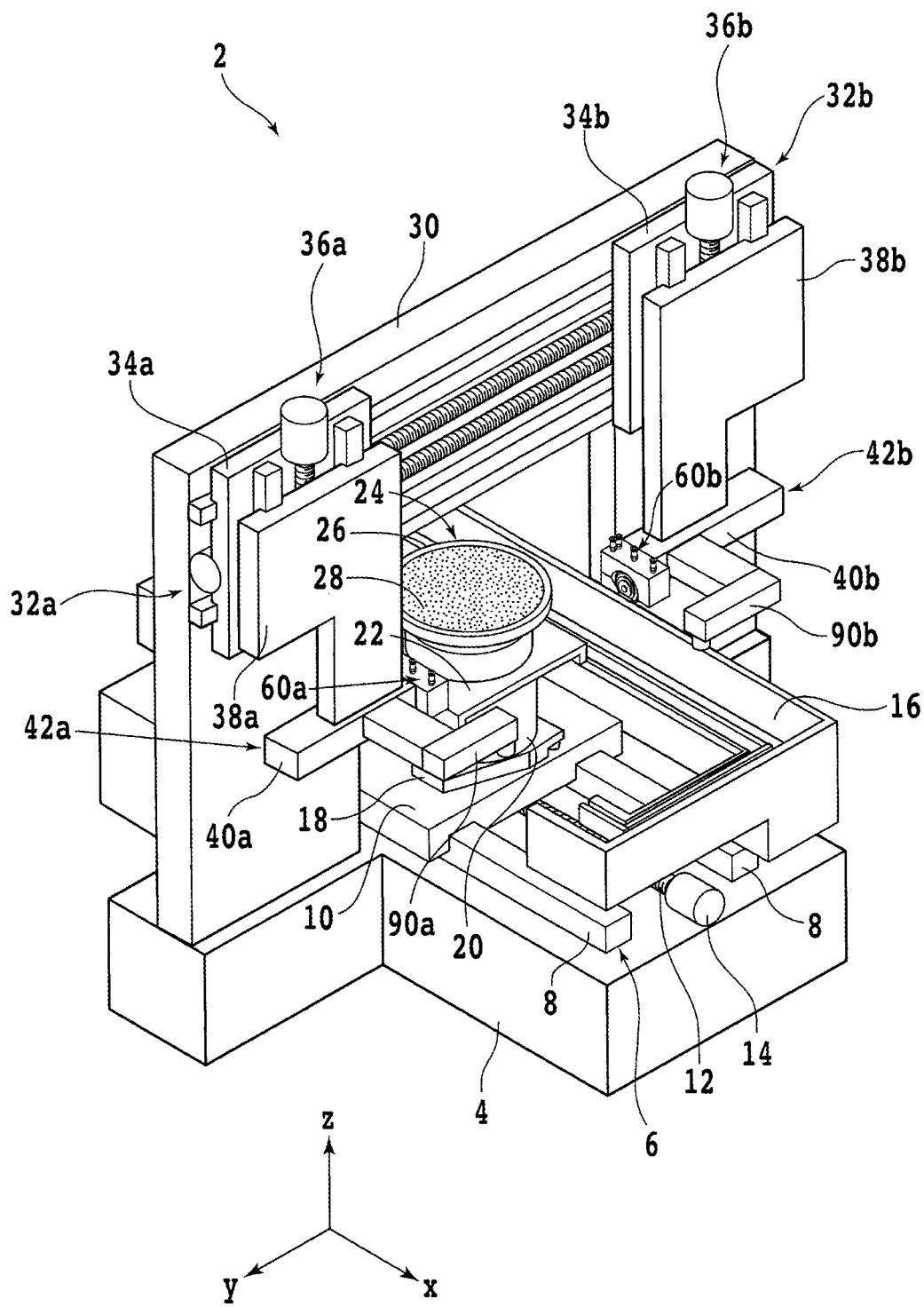
FIG. 1 is a perspective view schematically illustrating a cutting apparatus by way of example.

A preferred embodiment of the present invention will be described in detail below with reference to the accompanying drawings. FIG. 1 schematically illustrates in perspective by way of example a cutting apparatus that performs edge trimming on a wafer. In FIG. 1, the cutting apparatus, denoted by 2, is illustrated in reference to a three-dimensional coordinate system having X-, Y-, and Z-axes indicated respectively by the arrows X, Y, and Z. The X-axis and the Y-axis lie on a horizontal plane, whereas the Z-axis extends vertically and perpendicularly to the horizontal plane. X-axis directions, i.e., forward and rearward directions, extend parallel to the X-axis, and Y-axis directions, i.e., leftward and rightward directions, extend parallel to the Y-axis. Z-axis directions, i.e., upward and downward directions, extend parallel to the Z-axis and perpendicularly to the X-axis and the Y-axis.

The cutting apparatus 2 has a base 4 supporting various components of the cutting apparatus 2 thereon. Specifically, the base 4 supports a ball-screw-type X-axis moving mechanism 6 thereon. The X-axis moving mechanism 6 includes a pair of guide rails 8 that are mounted on the base 4 and that extend along the X-axis.

An X-axis movable plate 10 is slidably mounted on upper portions of the guide rails 8 for sliding movement along the X-axis. A screw shaft 12 extending along the X-axis is disposed between the guide rails 8.

An electric motor 14 for rotating the screw shaft 12 about its central axis is coupled to an end of the screw shaft 12. The screw shaft 12 has an externally threaded outer circumferential surface operatively threaded through an unillustrated nut housing therein a number of unillustrated balls that rollingly circulate in the nut upon rotation of the screw shaft 12 about its central axis. The screw shaft 12, the nut, and the balls jointly make up a ball screw.

The nut is fixed to a lower surface of the X-axis movable plate 10. Therefore, when the electric motor 14 is energized, it rotates the screw shaft 12, causing the nut and the balls to move the X-axis movable plate 10 along the X-axis, i.e., in one or the other of the X-axis directions.

A water case 16 for temporarily storing liquid, i.e., water, that is supplied to a wafer that is being cut by the cutting apparatus 2 is disposed around the X-axis moving mechanism 6. The liquid that is stored in the water case 16 is discharged from the water case 16 through an unillustrated drain port or the like and hence out of the cutting apparatus 2.

A table base 18 is fixedly mounted on an upper surface, i.e., a face side, of the X-axis movable plate 10. The table base 18 supports a cylindrical θ table 20 on an upper surface thereof.

A cover 22 having a rectangular upper surface is disposed around the θ table 20. A disk-shaped chuck table 24 that includes in its upper portion a holding surface for holding a wafer thereon is fixedly mounted on an upper surface of the θ table 20.

The θ table 20 is coupled to an unillustrated rotary actuator such as an electric motor for rotating the θ table 20 and the chuck table 24 about a rotational axis extending parallel to the Z-axis through the center of the holding surface of the chuck table 24.

The chuck table 204 has a disk-shaped frame 26 made of a metal material such as stainless steel. The frame 26 has an upwardly open circular cavity defined in an upper surface thereof. The cavity houses a disk-shaped porous plate 28 securely therein. The porous plate 28 is made of porous ceramic and is generally equal in diameter to the cavity.

The porous plate 28 is fluidly connected to an unillustrated suction source such as a vacuum pump through an unillustrated fluid channel defined in the frame 26. When the suction source is actuated, it produces a negative pressure that is transmitted to a space near an upper surface of the porous plate 28, i.e., the holding surface of the chuck table 24.

Therefore, when the suction source is actuated while a wafer is placed on the holding surface of the chuck table 24, the wafer is held under suction on the holding surface of the chuck table 24 by the negative pressure applied from the vacuum source.

Figure 2A:
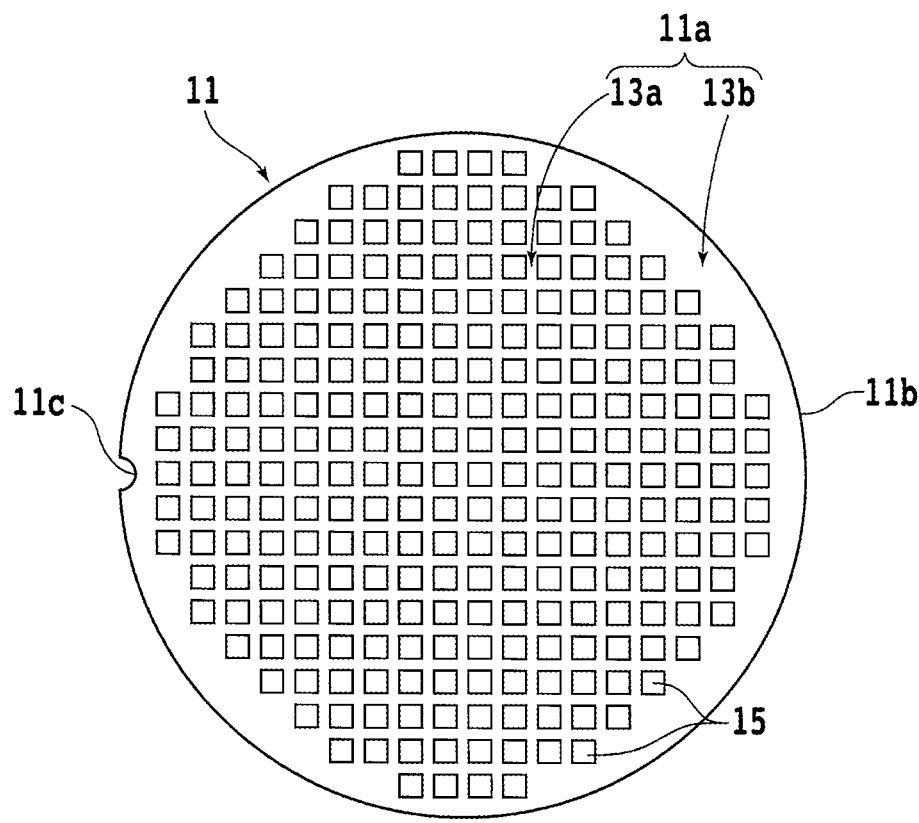
FIG. 2A is a plan view schematically illustrating a wafer by way of example.
Figure 2B:
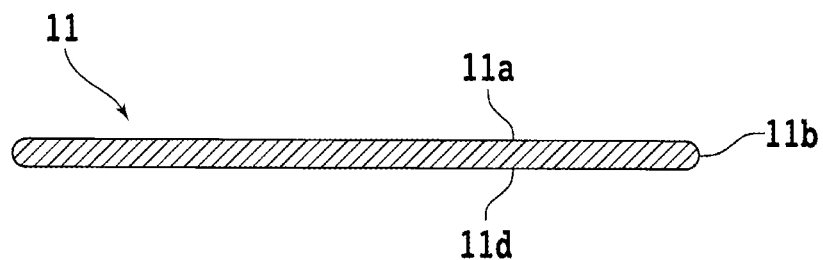
FIG. 2B is a schematic cross-sectional view of the wafer illustrated in FIG. 2A.

FIG. 2A schematically illustrates in plan a wafer to be held on the holding surface of the chuck table 24 by way of example. FIG. 2B schematically illustrates the wafer in cross section.

The wafer, denoted by 1 in FIGS. 2A and 2B, is made of a monocrystalline semiconductor material such as silicon (Si), silicon carbide (SiC), or gallium nitride (GaN), for example. The wafer 11 has a face side 11a including a device region 13a and an outer circumferential excess region 13b surrounding the device region 13a.

The device region 13a has a plurality of areas demarcated by a grid of projected dicing lines. Each of the areas has a device 15 such as an IC or an LSI circuit formed therein. The wafer 11 has a beveled outer circumferential edge portion, providing a curved side surface 11b that protrudes outwardly.

The wafer 11 also has a notch 11c defined in its outer circumferential edge portion as representing the crystal orientation of the material of the wafer 11. In performing edge trimming on the wafer 11, the wafer 11 has a reverse side 11d placed on the holding surface of the chuck table 24, i.e., the upper surface of the porous plate 28, directly or with a dicing tape interposed therebetween.

In the cutting apparatus 2 illustrated in FIG. 1, the movement of the table base 18 along the X-axis is controlled by the X-axis moving mechanism 6. The chuck table 24 is supported on the table base 18 by the θ table 20. Therefore, the chuck table 24 is movable with the table base 18 along the X-axis.

The cutting apparatus 2 further includes a portal-shaped support structure 30 disposed on the base 4 in straddling relation to the X-axis moving mechanism 6. The support structure 30 supports, on a front surface, i.e., a face side, thereof, a pair of ball-screw-type Y-axis moving mechanisms 32a and 32b. Each of the Y-axis moving mechanisms 32a and 32b has components similar to those of the X-axis moving mechanism 6.

The Y-axis moving mechanism 32a moves a Y-axis movable plate 34a along the Y-axis in a range kept out of contact with a Y-axis movable plate 34b. Similarly, the Y-axis moving mechanism 32b moves the Y-axis movable plate 34b along the Y-axis in a range kept out of contact with the Y-axis movable plate 34a.

Ball-screw-type Z-axis moving mechanisms 36a and 36b are mounted on respective front surfaces, i.e., face sides, of the Y-axis movable plates 34a and 34b. Each of the Z-axis moving mechanisms 36a and 36b has components similar to those of the X-axis moving mechanism 6.

The Z-axis moving mechanism 36a moves a Z-axis movable plate 38a along the Z-axis, whereas the Z-axis moving mechanism 36b moves a Z-axis movable plate 38b along the Z-axis.

Tubular housings 40a and 40b having side surfaces facing each other and extending along the Y-axis are fixed to respective lower portions of the Z-axis movable plates 38a and 38b. The housings 40a and 40b house respective cutting units 42a and 42b therein.

The cutting unit 42a has some components exposed from the side surface of the housing 40a that faces the side surface of the housing 40b. Similarly, the cutting unit 42b has some components exposed from the side surface of the housing 40b that faces the side surface of the housing 40a.

Figure 3:
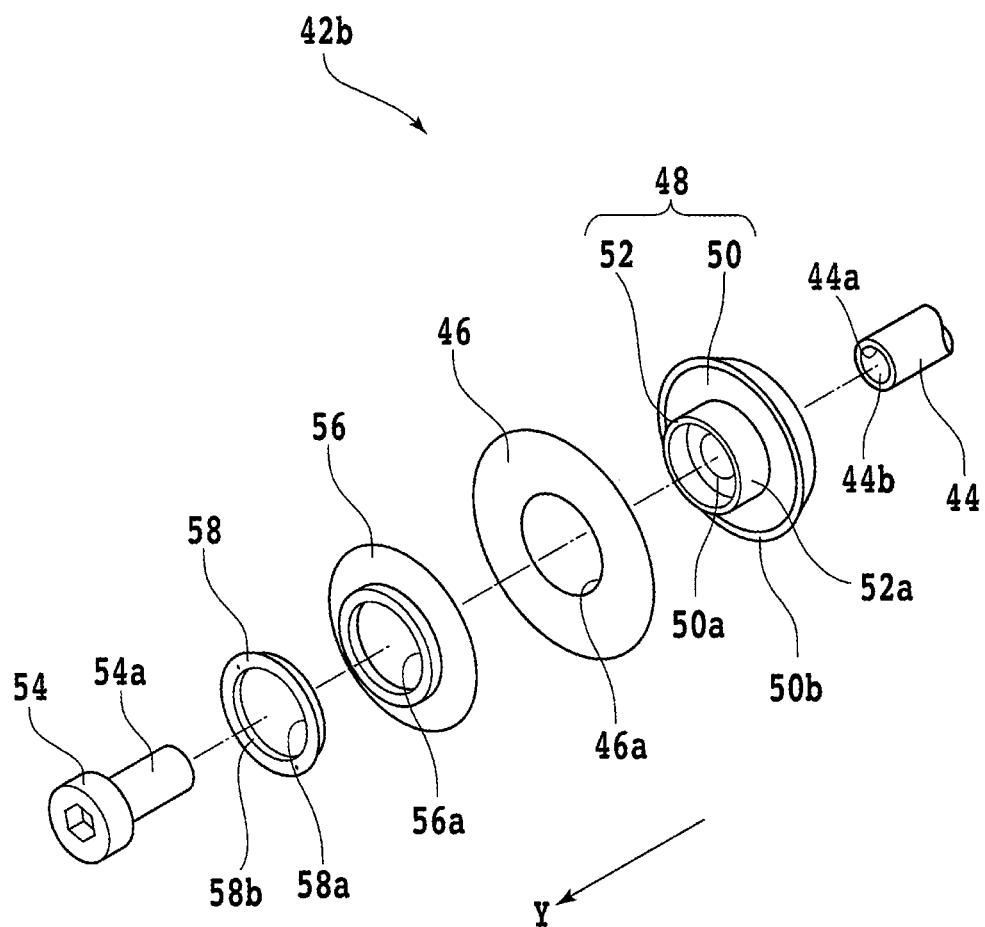
FIG. 3 is an exploded perspective view schematically illustrating components of a cutting unit of the cutting apparatus illustrated in FIG. 1.

The components of the cutting unit 42a are identical to the components of the cutting unit 42b. Hence, only the components of the cutting unit 42b will be described below with reference to FIG. 3. FIG. 3 schematically illustrates in exploded perspective the components of the cutting unit 42b that are not housed in but exposed from the housing 40b.

The cutting unit 42b has a spindle 44 having a distal end portion protruding from the housing 40b. The spindle 44 is rotatably supported in the housing 40b for rotation about a rotational axis extending parallel to the Y-axis.

The spindle 44 has an opposite end coupled to an unillustrated rotary actuator such as an electric motor for rotating the spindle 44. The rotary actuator is housed in the housing 40b.

A mount 48 on which to mount an annular cutting blade 46 is attached to the distal end portion of the spindle 44. The end portion of the spindle 44 has an opening 44a defined therein. The spindle 44 has an internally threaded inner wall surface 44b.

The mount 48 has a disk-shaped flange 50 and a boss 52 that axially protrudes from a face side of the flange 50 and that faces away from the spindle 44. The flange 50 has an opening 50a defined centrally therein. The opening 50a extends axially through the flange 50. The flange 50 has a reverse side facing the spindle 44 and having an unillustrated fitting portion in which the distal end portion of the spindle 44 is fitted.

With the distal end portion of the spindle 44 being fitted in the fitting portion of the flange 50, the mount 48 can be secured to the spindle 44 by a mount fixing bolt 54 inserted through the opening 50a and threaded into the opening 44a. The mount fixing bolt 54 has an externally threaded outer wall surface 54a for threaded engagement with the internally threaded inner wall surface 44b of the spindle 44.

The face side of the flange 50 acts as an abutment surface 50b for abutment against a reverse side of the cutting blade 46. The abutment surface 50b is of an annular shape as viewed in the directions along which the spindle 44 extends, i.e., along the Y-axis. The boss 52 is of a hollow cylindrical shape having an externally threaded outer wall surface 52a.

The cutting blade 46 has an opening 46a defined centrally therein for receiving the boss 52 therein. When the boss 52 is inserted in the opening 46a, the cutting blade 46 is mounted on the mount 48.

With the cutting blade 46 being mounted on the mount 48, an annular flange 56 is attached to a face side of the cutting blade 46. The flange 56 has an opening 56a defined centrally therein. The boss 52 of the mount 48 is fitted in the opening 56a.

The flange 56 has a reverse side acting as an unillustrated abutment surface for abutment against the face side of the cutting blade 46. The abutment surface of the flange 56 is of an annular shape commensurate in size with the abutment surface 50b of the mount 48.

After the flange 56 has been attached to the face side of the cutting blade 46, an annular flange fixing nut 58 is threaded over a distal end portion of the externally threaded outer wall surface 52a of the boss 52. As the flange fixing nut 58 is tightened, it axially presses the flange 56 toward the mount 48, causing the flange 56 to grip the cutting blade 46 between itself and the mount 48.

Specifically, the face side of the cutting blade 46 abuts against the abutment surface of the flange 56, and the reverse side of the cutting blade 46 abuts against the abutment surface 50b of the mount 48, so that the cutting blade 46 is held in position between the flange 56 and the mount 48.

The flange fixing nut 58 has an opening 58a defined centrally therein. The flange fixing nut 58 also has an internally threaded inner wall surface 58b around the opening 58a for threaded engagement with the externally threaded outer wall surface 52a of the boss 52.

As illustrated in FIG. 1, liquid supply units 60a and 60b are disposed around those components of the cutting units 42a and 42b that are not housed in but exposed from the housings 40a and 40b. The components included in the liquid supply unit 60a are identical to the components included in the liquid supply unit 60b.

Figure 4:
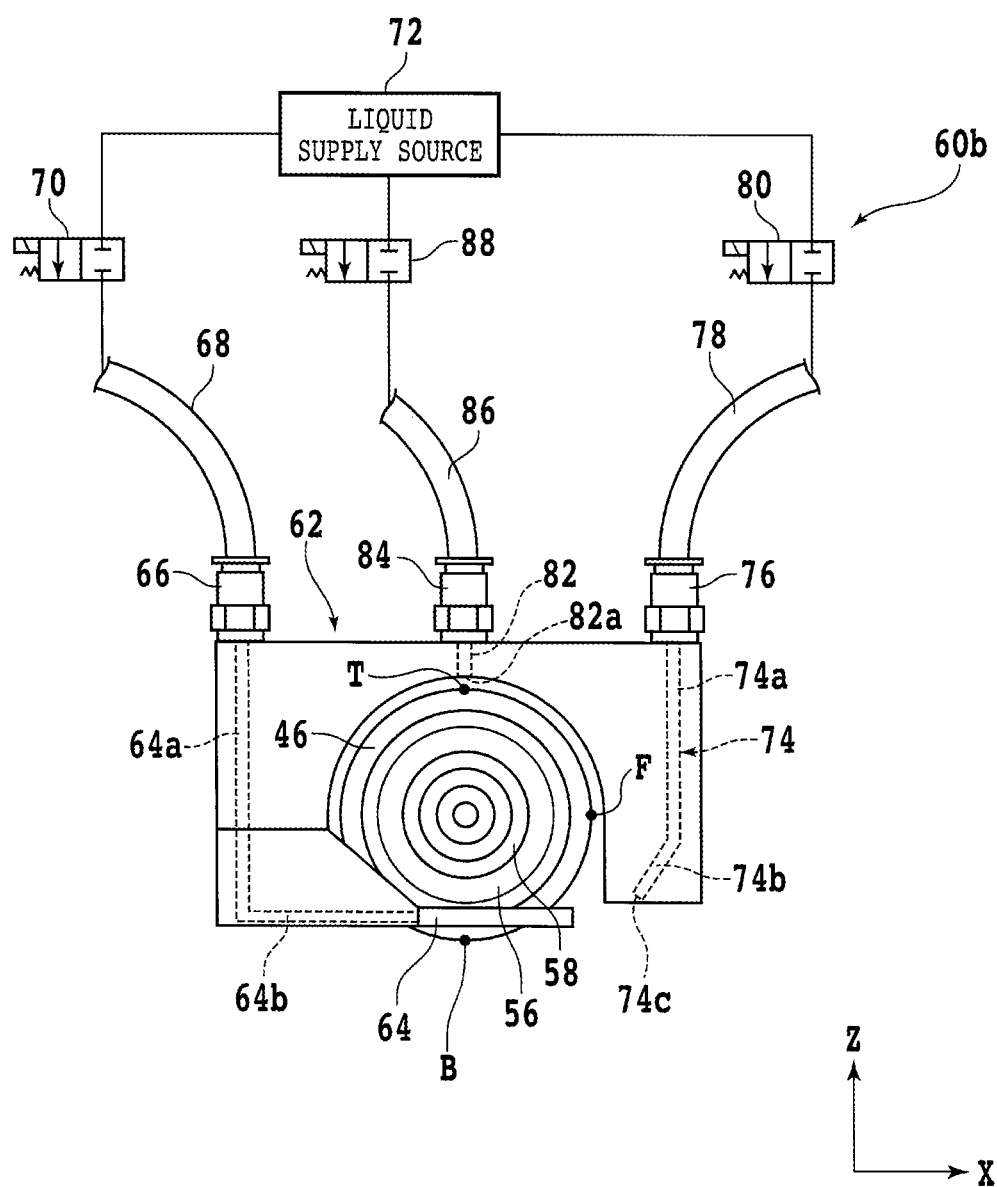
FIG. 4 is a side elevational view schematically illustrating components of a liquid supply unit of the cutting apparatus illustrated in FIG. 1.

Hence, only the components of the liquid supply unit 60b will be described below with reference to FIG. 4. FIG. 4 schematically illustrates in side elevation the components of the liquid supply unit 60b. In FIG. 4, some of the components of the liquid supply unit 60b are illustrated as simplified.

The liquid supply unit 60b has a blade cover 62 surrounding an outer circumferential edge of the cutting blade 46 except a portion near a lower end B thereof. A pair of L-shaped nozzles 64 are fixed to respective inner surfaces of the blade cover 62, one on each side of the cutting blade 46.

Each of the nozzles 64 includes a vertical proximal end portion 64a extending vertically along the Z-axis in the blade cover 62 behind the cutting blade 46 and a horizontal distal end portion 64b extending horizontally from a lower end of the vertical proximal end portion 64a along the X-axis in and out of the blade cover 62 in the vicinity of a lower end portion of the cutting blade 46. Each of the nozzles 64 is fluidly connected to a liquid supply source 72 through a coupling 66 mounted on the blade cover 62, a tube 68 connected to the coupling 66, and a valve 70 connected to the tube 68.

Each of the nozzles 64 has a plurality of unillustrated slits defined in the horizontal distal end portion 64b thereof and facing the cutting blade 46. When the valve 70 is opened, liquid supplied from the liquid supply source 72 flows from the valve 70 through the tube 68 and the coupling 66 and is ejected from the slits in the nozzles 64 to the portion of the cutting blade 46 near the lower end B thereof.

Another nozzle 74 is disposed in the blade cover 62 in front of the cutting blade 46. The nozzle 74 is horizontally spaced from the cutting blade 46 as viewed along the Y-axis and overlaps the cutting blade 46 as viewed along the X-axis. The nozzle 74 includes an upper portion 74a extending vertically straight along the Z-axis and a lower portion 74b extending obliquely downwardly straight from a lower end of the upper portion 74a.

The nozzle 74 is fluidly connected to the liquid supply source 72 through a coupling 76 mounted on the blade cover 62, a tube 78 connected to the coupling 76, and a valve 80 connected to the tube 78.

The lower portion 74b of the nozzle 74 has an opening 74c defined in a lower distal end thereof. When the cutting blade 46 cuts the wafer 11 on the chuck table 24, the lower distal end with the opening 74c defined therein faces a region of the wafer 11 that is positioned below a front end F of the cutting blade 46.

When the valve 80 is opened at the time when the cutting blade 46 cuts the wafer 11 on the chuck table 24, the liquid supplied from the liquid supply source 72 flows from the valve 80 through the tube 78 and the coupling 76 and is ejected from the opening 74c in the nozzle 74 to the region of the wafer 11 below the front end F of the cutting blade 46.

Still another nozzle 82 is disposed in the blade cover 62 above the cutting blade 46. The nozzle 82 is positioned immediately above an upper end T of the cutting blade 46 and extends vertically straight along the Z-axis. The nozzle 82 is fluidly connected to the liquid supply source 72 through a coupling 84 mounted on the blade cover 62, a tube 86 connected to the coupling 84, and a valve 88 connected to the tube 86.

The nozzle 82 has an opening 82a defined in a lower distal end thereof. The lower distal end with the opening 82a defined therein faces the upper end T of the cutting blade 46. When the valve 88 is opened, the liquid supplied from the liquid supply source 72 flows from the valve 88 through the tube 86 and the coupling 84 and is ejected from the opening 82a in the nozzle 82 to the upper end T of the cutting blade 46.

As illustrated in FIG. 1, image capturing units 90a and 90b are fixedly mounted on respective front surfaces of the housings 40a and 40b. Each of the image capturing units 90a and 90b captures an image of the wafer 11 held on the holding surface of the chuck table 24, for example.

Each of the image capturing units 90a and 90b includes a light source such as a light-emitting diode (LED), an objective lens, and an image capturing device such as a charge-coupled-device (CCD) image sensor or a complementary-metal-oxide-semiconductor (CMOS) image sensor.

FIG. 5 schematically illustrates by way of example a sequence of a method of processing the wafer 11 by performing edge trimming of the wafer 11 on the cutting apparatus 2 according to the embodiment of the present invention. According to the method, the wafer 11 is held on the holding surface of the chuck table 24 rotatably along circumferential directions of the wafer 11 with the face side 11a of the wafer 11 facing upwardly (holding step S1).

Specifically, the X-axis moving mechanism 6 is actuated to position the chuck table 24 on a front side of the base 4, and then, the wafer 11 is placed on the chuck table 24 such that the center of the holding surface of the chuck table 24 and the center of the reverse side 11d of the wafer 11 are aligned with each other. Then, the suction source fluidly connected to the porous plate 28 of the chuck table 24 is actuated to hold the wafer 11 under suction on the chuck table 24.

Figure 6A:
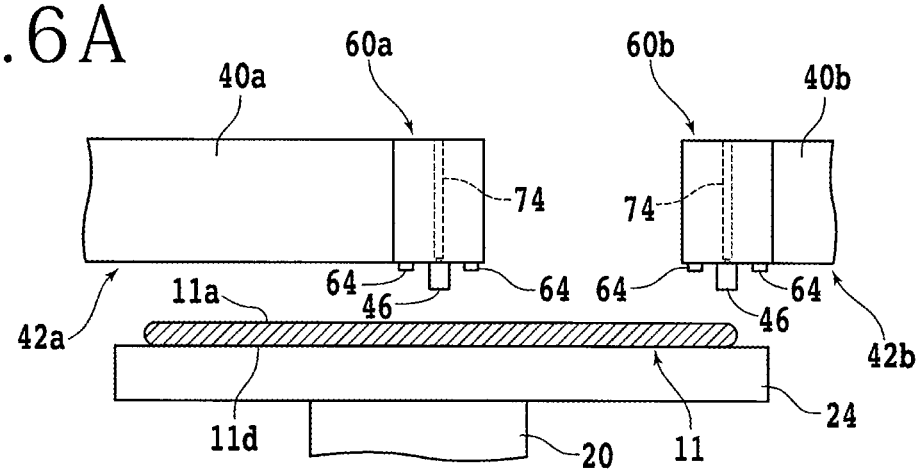
FIG. 6A is a front elevational view, partly in cross section, schematically illustrating the manner in which a processing step of the method is carried out.
Figure 6B:
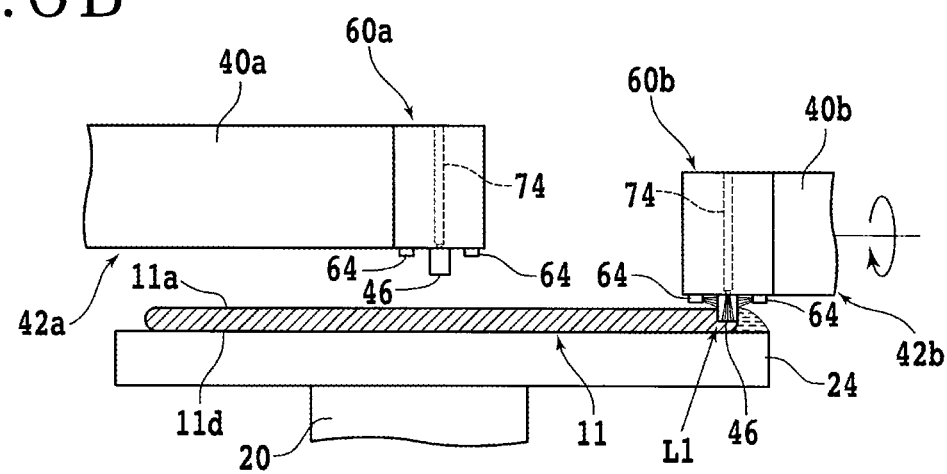
FIG. 6B is a front elevational view, partly in cross section, schematically illustrating the manner in which the processing step of the method is carried out.
Figure 6C:
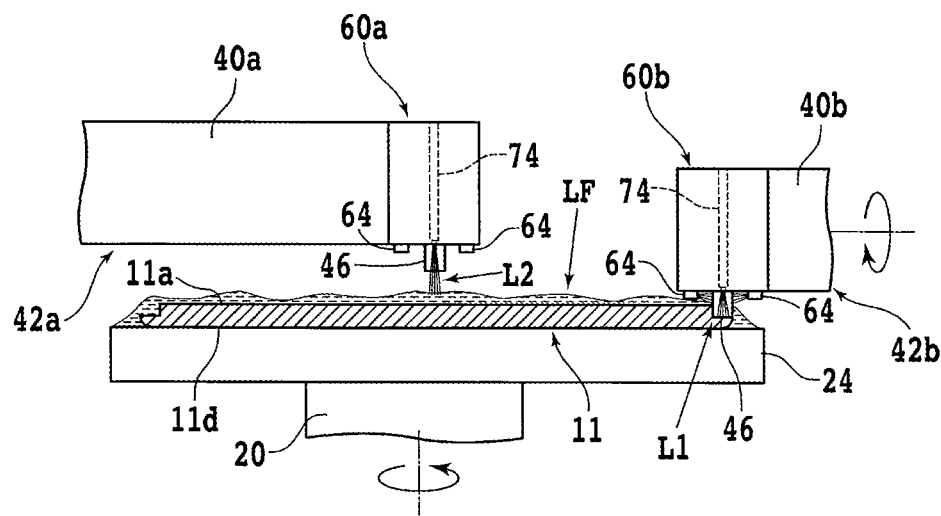
FIG. 6C is a front elevational view, partly in cross section, schematically illustrating the manner in which the processing step of the method is carried out.

Then, while a cleaning liquid is supplied to the center of the face side 11a of the wafer 11 and the wafer 11 is rotated to form a film of the cleaning liquid that covers the face side 11a of the wafer 11, edge trimming is performed on the wafer 11 (processing step S2). FIGS. 6A, 6B, and 6C schematically illustrate in front elevation, partly in cross section, the manner in which processing step S2 is carried out.

In processing step S2, the X-axis moving mechanism 6 and the Y-axis moving mechanisms 32a and 32b are actuated to position the liquid supply unit 60a above the center of the face side 11a of the wafer 11 and also to position the cutting blade 46 of the cutting unit 42b above the outer circumferential edge portion of the wafer 11 (see FIG. 6A).

Then, the valves 70, 80, and 88 are opened to supply the liquid as a cutting liquid L1 from the nozzles 64, 74, and 82 of the liquid supply unit 60b, and the rotary actuator housed in the housing 40b is energized to rotate the cutting blade 46 of the cutting unit 42b. Then, the Z-axis moving mechanism 36b is actuated to cause the lower end of the cutting blade 46 of the cutting unit 42b to cut into the outer circumferential edge portion of the wafer 11 (see FIG. 6B).

While the cutting liquid L1 is supplied from the nozzles 64, 74, and 82 of the liquid supply unit 60b and the cutting blade 46 of the cutting unit 42b is rotated, the valve 80 is opened to supply the liquid as a cleaning liquid L2 from the nozzle 74 of the liquid supply unit 60a to the center of the face side 11a of the wafer 11, and the rotary actuator coupled to the θ table 20 is energized to rotate the wafer 11 held on the chuck table 24 about its rotational axis (see FIG. 6C).

At this time, the cleaning liquid L2 is supplied at a flow rate ranging from 1.0 to 0.1 l/min, for example. Preferably, the cleaning liquid L2 is supplied at a flow rate ranging from 0.5 to 0.1 l/min, and more preferably at a flow rate ranging from 0.3 to 0.1 l/min. At this time, the chuck table 24, i.e., the wafer 11, is rotated at a speed ranging from 90 to 120 deg/sec, for example.

In processing step S2 thus performed, a part of the outer circumferential edge portion of the wafer 11 on its face side 11a is cut away by the cutting blade 46. In other words, edge trimming is performed on the wafer 11. The cleaning liquid L2 supplied from the nozzle 74 of the liquid supply unit 60a to the center of the face side 11a of the wafer 11 is spread radially outwardly under centrifugal forces, forming a film LF of the cleaning liquid that covers the entire face side 11a of the wafer 11.

In processing step S2, the film LF of the cleaning liquid on the face side 11a of the wafer 11 prevents the face side 11a from being dried, reducing the probability that the swarf will be introduced into the devices 15. Further, in processing step S2, the consumption of the cleaning liquid L2 is reduced compared with a step of performing edge trimming on the wafer 11 while supplying a curtain of cleaning liquid to the entire face side 11a of the wafer 11.

The method described above is based on an aspect of the present invention, and changes and modifications may be made according to the present invention. For example, according to the present invention, edge trimming may be performed stepwise on the outer circumferential edge portion of the wafer 11 in order to reduce edge trimming loads on the wafer 11.

Specifically, in processing step S2 according to the present invention, a cutting step of increasing the depth by which the lower end portion of the rotating cutting blade 46 cuts into the outer circumferential edge portion of the wafer 11 from the face side 11a, and a rotating step of rotating the wafer 11 in at least one revolution may alternately be repeated.

Figure 7:
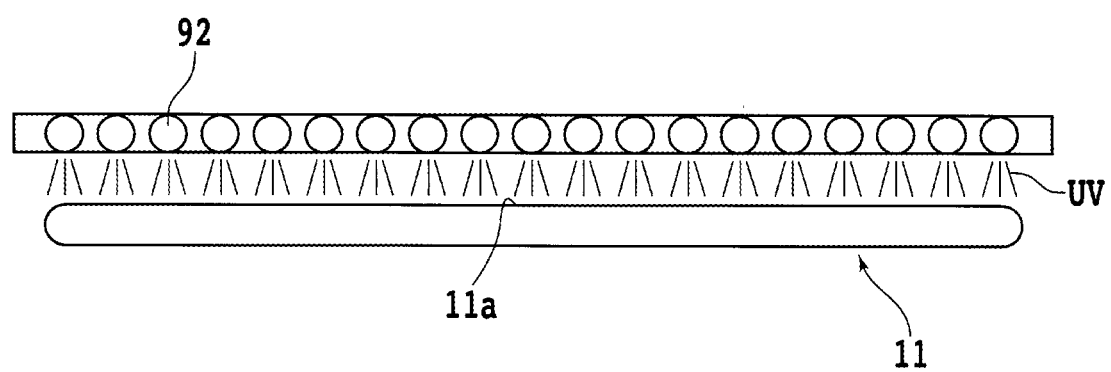
FIG. 7 is a front elevational view schematically illustrating the manner in which an ultraviolet ray applying step is carried out.

According to the present invention, moreover, an ultraviolet ray applying step may be carried out prior to processing step S2 to apply ultraviolet rays to the face side 11a of the wafer 11. FIG. 7 schematically illustrates in front elevation the manner in which the ultraviolet ray applying step is carried out. In the ultraviolet ray applying step, ultraviolet ray lamps 92 apply ultraviolet rays UV to the face side 11a of the wafer 11 in the atmosphere, for example.

When the ultraviolet rays UV are applied to the face side 11a of the wafer 11, active oxygen is produced from oxygen present in the atmosphere. The produced active oxygen reacts with organic materials present on the face side 11a of the wafer 11, forming hydrophilic substituents. As a result, the face side 11a of the wafer 11 is rendered hydrophilic. The face side 11a of the wafer 11 can thus easily be wet, further reducing the consumption of the cleaning liquid L2.

The structure, method, etc., according to the above embodiment may be changed or modified appropriately without departing from the scope of the present invention.

EXAMPLES

Inventive Examples 1 through 3 and Comparative Examples 1 and 2 of the present invention will be described below. In Inventive Examples 1 through 3, edge trimming was performed on the wafer 11 while the cleaning liquid L2 was supplied to the center of the face side 11a of the wafer 11. Thereafter, the number of particles of swarf attached to the face side 11a was assessed.

In Inventive Example 1 (In. Ex. 1), the flow rate of the cleaning liquid L2 was set to 0.2 l/min. In Inventive Example 2 (In. Ex. 2), the flow rate of the cleaning liquid L2 was set to 0.4 l/min. Inventive Example 3 (In. Ex. 3), the flow rate of the cleaning liquid L2 was set to 0.2 l/min, and ultraviolet rays were applied to the face side 11a of the wafer 11 before edge trimming on the wafer 11.

In Comparative Example 1 (Co. Ex. 1), edge trimming was performed on the wafer 11 while a curtain of cleaning liquid was supplied to the entire face side 11a of the wafer 11. Thereafter, the number of particles of swarf attached to the face side 11a was assessed. In Comparative Example 1, the curtain of cleaning liquid was supplied at a flow rate of 2.5 l/min.

In Comparative Example 2 (Co. Ex. 2), edge trimming was performed on the wafer 11 without supplying the cleaning liquid L2 to the center of the face side 11a of the wafer 11. Thereafter, the number of particles of swarf attached to the face side 11a was assessed.

Table 1 given below illustrates the numbers of particles of swarf attached to the face side 11a after edge trimming on the wafer 11 according to Inventive Examples 1 through 3 and Comparative Examples 1 and 2.

TABLE 1

| In. Ex. 1 | In. Ex. 2 | In. Ex. 3 | Co. Ex. 1 | Co. Ex. 2 |
|---|---|---|---|---|
| 436 | 300 | 294 | 315 | 724 |

As illustrated in Table 1, it is understood that the number of particles of swarf attached to the face side 11a of the wafer 11 is reduced when edge trimming is performed on the wafer 11 while the cleaning liquid L2 is supplied to the center of the face side 11a of the wafer 11 (see Inventive Examples 1 through 3 and Comparative Example 2).

It is also seen that the consumption of the cleaning liquid L2 required to reduce the number of particles of swarf attached to the face side 11a is greatly reduced compared with the step of supplying a curtain of cleaning liquid to the entire face side 11a of the wafer 11 (see Inventive Examples 1 and 2 and Comparative Example 1).

Further, it is understood that the consumption of the cleaning liquid L2 required to reduce the number of particles of swarf attached to the face side 11a is additionally reduced by applying, before edge trimming on the wafer 11, ultraviolet rays to the face side 11a of the wafer 11 to render the face side 11a hydrophilic (see Inventive Examples 1 through 3).

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A method of processing a wafer having a plurality of devices formed on a face side thereof and having a beveled outer circumferential edge portion, the method comprising the steps of:
    a holding step of holding the wafer rotatably along circumferential directions thereof with the face side facing upwardly;
    a processing step of, after the holding step, processing the outer circumferential edge portion of the wafer by, while a lower end portion of an annular cutting blade that is rotating is cutting into the outer circumferential edge portion of the wafer, supplying a cleaning liquid to a center of the face side of the wafer and a rotating step of rotating the wafer to form a film of the cleaning liquid that covers the face side of the wafer; and
    an ultraviolet ray applying step of, before the processing step, applying ultraviolet rays to the face side of the wafer to render the face side hydrophilic.

2. The method of processing a wafer according to claim 1, wherein
    the processing step further comprises:
        a cutting step of increasing a depth by which the lower end portion of the rotating cutting blade cuts into the outer circumferential edge portion of the wafer from the face side, and
        the rotating step of rotating the wafer in at least one revolution, and
        the cutting step and the rotating step are alternately repeated.

* * * * *